(12) United States Patent
Ji et al.

(10) Patent No.: US 10,209,406 B2
(45) Date of Patent: Feb. 19, 2019

(54) TRANSPARENT DISPLAY DEVICE INCLUDING AN EMITTING AREA AND A TRANSMITTING AREA

(71) Applicant: LG DISPLAY CO., LTD., Seoul (KR)

(72) Inventors: Seok-Won Ji, Paju-si (KR); Jong-Moo Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/668,865

(22) Filed: Aug. 4, 2017

(65) Prior Publication Data
US 2018/0180772 A1   Jun. 28, 2018

(30) Foreign Application Priority Data
Dec. 22, 2016 (KR) .................. 10-2016-0176627

(51) Int. Cl.
| H04N 5/66 | (2006.01) |
| H04N 9/12 | (2006.01) |
| G02B 1/11 | (2015.01) |
| H01L 51/52 | (2006.01) |
| H01L 27/32 | (2006.01) |
| G02B 5/28 | (2006.01) |

(52) U.S. Cl.
CPC ............ *G02B 1/11* (2013.01); *G02B 5/285* (2013.01); *H01L 27/322* (2013.01); *H01L 27/326* (2013.01); *H01L 51/5281* (2013.01); *G09G 2320/0242* (2013.01); *H01L 51/5262* (2013.01)

(58) Field of Classification Search
CPC .......... G02B 1/11; G02B 5/285; G02B 27/00; G09G 2320/0242; H04N 5/66; H04N 9/12

USPC ............... 348/617, 739; 359/605, 601, 609
See application file for complete search history.

(56) References Cited

U.S. PATENT DOCUMENTS

| 7,791,257 B2* | 9/2010 | Hirata .......... H01J 11/12 313/110 |
| 8,582,045 B2* | 11/2013 | Kang ........... G02F 1/133502 349/58 |
| 2009/0195152 A1 | 8/2009 | Sawano |
| 2010/0244010 A1 | 9/2010 | Moriya |
| 2011/0032622 A1* | 2/2011 | Kim ............ G02B 5/285 359/609 |
| 2014/0183472 A1 | 7/2014 | Kim et al. |

(Continued)

FOREIGN PATENT DOCUMENTS

| JP | 2002-071940 A | 3/2002 |
| JP | 2007-248491 A | 9/2007 |
| JP | 2000-258605 A | 9/2009 |

(Continued)

OTHER PUBLICATIONS

Extended European Search Report dated May 29, 2018 for a counterpart European patent application No. EP 17 21 0067.9.

(Continued)

*Primary Examiner* — Trang U Tran
(74) *Attorney, Agent, or Firm* — Polsinelli PC

(57) ABSTRACT

A transparent display device including an emitting area and a transmitting area is provided. An upper AR structure is disposed on an upper substrate. The upper AR structure includes an upper reflection-preventing layer and an upper color-compensating layer having a blue dye. As a result, the transparency of the transmitting area is increased.

20 Claims, 4 Drawing Sheets

(56) References Cited

U.S. PATENT DOCUMENTS

2015/0318514 A1 11/2015 Kim
2016/0266695 A1* 9/2016 Bae ...................... G06F 1/1643

FOREIGN PATENT DOCUMENTS

| JP | 2013-214365 A | 10/2013 |
| JP | 2015-143843 A | 8/2015 |
| WO | 2014084388 A1 | 6/2014 |
| WO | 2016/088352 A1 | 6/2016 |

OTHER PUBLICATIONS

Office Action with English translation dated Sep. 25, 2018 issued in the corresponding Japanese Patent Application No. 2017-241638, pp. 1-6.

* cited by examiner

TRANSPARENT DISPLAY DEVICE INCLUDING AN EMITTING AREA AND A TRANSMITTING AREA

CROSS-REFERENCE TO RELATED APPLICATION

This application claims the benefit of Korean Patent Application No. 10-2016-0176627, filed on Dec. 22, 2016, which is hereby incorporated by reference in its entirety as if fully set forth herein.

BACKGROUND

Field of the Disclosure

The present disclosure relates to a display device, and more particularly, to a transparent display device that includes pixel areas, each of the pixel areas having an emitting area and a transmitting area.

Description of the Background

Generally, electronic apparatuses, such as monitors, TVs, laptop computers, and digital cameras, comprise display devices for displaying images. For example, the display devices include a liquid crystal display device or an organic light-emitting display device.

The display device includes pixel areas. Each of the pixel areas displays different color from the adjacent pixel area. For example, the pixel area of the display device includes a blue pixel area displaying blue, a red pixel area displaying red, a green pixel area displaying green, and a white pixel area displaying white.

The display device can be transparent. For example, each of the pixel areas of the display device can further include a transmitting area configured to transmit external light therethrough. The transmitting area can be disposed parallel to emitting areas of the corresponding pixel area. For example, the transmitting areas of the adjacent pixel areas can be connected to each other.

However, because insulating films which insulate between conductive layers for operation of the emitting area are also stacked on the transmitting area, the transmitting area of the display device can display a yellowish color due to the stacked insulating films. That is, the transparency of the display device can be degraded due to the insulating films stacked on the transmitting area. Additionally, the display device can compensate for color variation attributable to the stacked insulating films by forming a blue coating layer containing blue dye on a lower substrate and/or an upper substrate. However, the blue coating layer can still deteriorate transmittance.

SUMMARY OF THE DISCLOSURE

Accordingly, the present disclosure is directed to a transparent display device including an emitting area and a transmitting area that substantially obviates one or more problems due to limitations and disadvantages of the related art.

The present disclosure is to provide a display device that is capable of preventing degradation of transparency due to insulating films stacked on a transmitting area.

In addition, the present disclosure is to provide a display device that is capable of compensating for color variation attributable to insulating films stacked on a transmitting area without deteriorating transmittance.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes a lower substrate. The lower substrate includes an emitting area and a transmitting area. A light-emitting structure is disposed on the emitting area of the lower substrate. An upper substrate is disposed on the light-emitting structure. The upper substrate extends to a region on the transmitting area of the lower substrate. An upper AR structure is disposed on the upper substrate. The upper AR structure includes an upper reflection-preventing layer and an upper color-compensating layer. The upper color-compensating layer contains a blue dye.

The upper color-compensating layer may have a thickness smaller than a thickness of the upper reflection-preventing layer.

The upper AR structure may further include an upper adhesive layer disposed close to the upper substrate. The upper color-compensating layer may have a thickness smaller than a thickness of the upper adhesive layer.

The blue dye may be contained in the upper color-compensating layer in a content that is greater than 0% and is less than or equal to 10%.

The blue dye may be contained in the upper color-compensating layer in a content that is greater than 0% and is less than or equal to 3%.

A lower AR structure may be disposed on the lower substrate. The lower AR structure may include a lower reflection-preventing layer and a lower adhesive layer.

The lower AR structure may further include a lower color-compensating layer. The lower color-compensating layer may be disposed between the lower reflection-preventing layer and the lower adhesive layer. The lower color-compensating layer may contain a blue dye.

In another aspect of the present disclosure, a display device includes a lower substrate and an upper substrate. The upper substrate is opposite the lower substrate. An upper reflection-preventing layer is disposed on the upper substrate. An upper color-compensating layer is disposed between the upper substrate and the upper reflection-preventing layer. The upper color-compensating layer contains a blue dye.

In a further aspect of the present disclosure, a display device having an emitting area and a transmitting area includes first and second substrates facing each other, the first substrate extending to the transmitting area of the second substrate; a light-emitting structure at the emitting area of the first substrate; and an anti-reflection (AR) structure disposed on at least one of the first and second substrates, the AR structure including a reflection-preventing layer and a color-compensating layer having a blue dye.

An upper support layer may be disposed between the upper color-compensating layer and the upper reflection-preventing layer.

The upper color-compensating layer may be in direct contact with the upper substrate. The upper color-compensating layer may contain an adhesive material.

A lower reflection-preventing layer may be disposed on the lower substrate. A lower adhesive layer may be disposed between the lower substrate and the lower reflection-preventing layer.

The upper color-compensating layer may have a thickness greater than a thickness of the lower adhesive layer.

The blue dye may be contained in the upper color-compensating layer in a content that is greater than 0% and is less than or equal to 0.15%.

The upper color-compensating layer may further contain a blue pigment.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
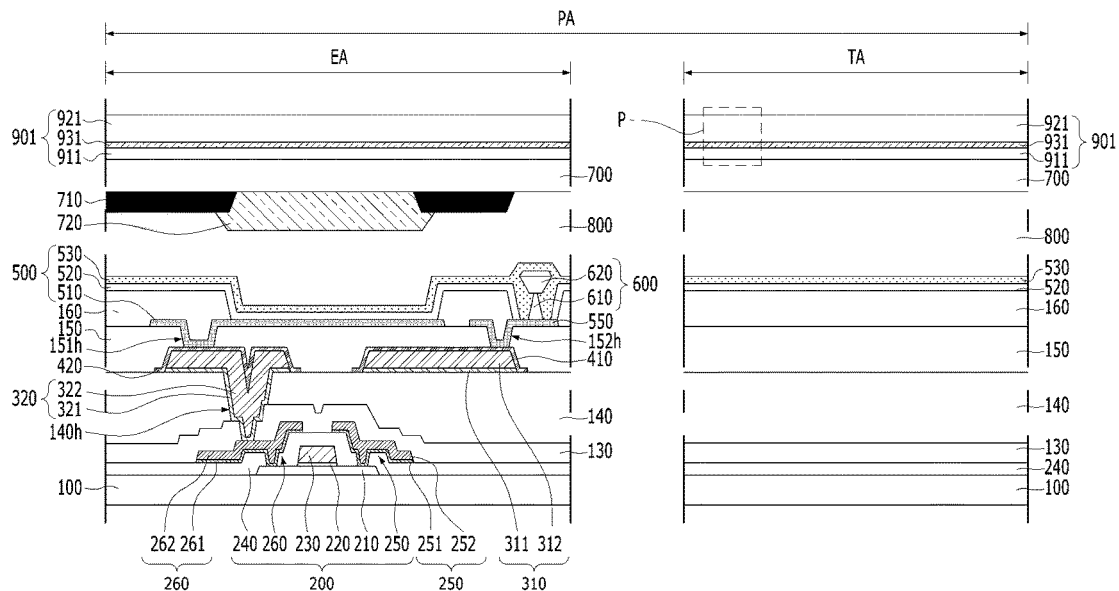
FIG. 1 is a cross-sectional view schematically illustrating a display device according to an aspect of the present disclosure.

The details of the above objects, technical configurations, and effects of the present disclosure will be clearly understood from the following detailed description taken in conjunction with the accompanying drawings showing aspects of the present disclosure. Although aspects of the present disclosure will be described, it will be apparent that the technical spirit of the present disclosure can be practiced by those skilled in the art without being restricted or limited to the aspects.

Further, throughout the specification, the same reference numerals represent the same components, and in the drawings, the length and thickness of layers or areas may be exaggerated for the sake of convenience. In addition, when a first element is referred to as being "on" a second element, it can be directly on the second element or be indirectly on the second element with a third element interposed therebetween.

It will be understood that the terms "first" and "second" are used herein to describe various elements and are only used to distinguish one element from another element. Thus, a first element may be termed a second element, and similarly, a second element may be termed a first element without departing from the teachings of the present disclosure.

Terms used in the following description are used only to describe the specific aspects and are not intended to restrict the present disclosure. The expression of singularity includes a plural meaning unless the singularity expression is explicitly different in context. In the specification, the terms "comprising," "including," and "having" shall be understood to designate the presence of particular features, numbers, steps, operations, elements, parts, or combinations thereof but not to preclude the presence or addition of one or more other features, numbers, steps, operations, elements, parts, or combinations thereof.

Unless otherwise defined, all terms used herein, which include technical or scientific terms, have the same meanings as those generally appreciated by those skilled in the art. The terms, such as ones defined in common dictionaries, should be interpreted as having the same meanings as terms in the context of pertinent technology, and should not be interpreted as having ideal or excessively formal meanings unless clearly defined in the specification.

EXAMPLES

Figure 2:
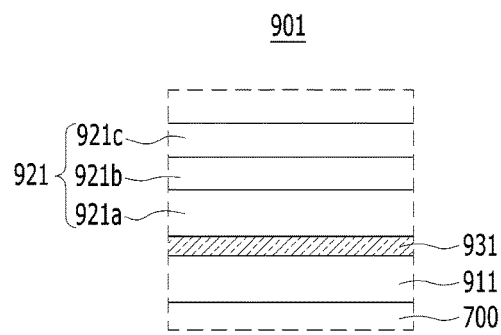
FIG. 2 is an enlarged view of region P in FIG. 1.

FIG. 1 is a cross-sectional view schematically illustrating a display device according to an aspect of the present disclosure. FIG. 2 is an enlarged view of region P in FIG. 1.

Referring to FIGS. 1 and 2, a display device according to the aspect of the present disclosure may include a lower substrate 100, a thin-film transistor 200, a light-emitting structure 500, an upper substrate 700, and an upper anti-reflection (AR) structure 901.

The lower substrate 100 may support the thin-film transistor 200 and the light-emitting structure 500. The lower substrate 100 may include an insulating material. The lower substrate 100 may include a transparent material. For example, the lower substrate 100 may include glass or plastic.

The lower substrate 100 may include pixel areas PA. Each of the pixel areas PA may display a unique color. The adjacent pixel areas PA may display different colors from each other. For example, the lower substrate 100 may include a blue pixel area PA for displaying blue, a red pixel area PA for displaying red, a green pixel area PA for displaying green, and a white pixel area PA for displaying white.

Each of the pixel areas PA may include an emitting area EA and a transmitting area TA. For example, the display device according to the aspect of the present disclosure may be a transparent display device.

The thin-film transistor 200 may be disposed on the emitting area EA of the lower substrate 100. For example, the thin-film transistor 200 may include a semiconductor pattern 210, a gate insulating film 220, a gate electrode 230, an interlayer insulating film 240, a source electrode 250, and a drain electrode 260.

The semiconductor pattern 210 may be disposed close to the lower substrate 100. The semiconductor pattern 210 may include a semiconductor material. For example, the semiconductor pattern 210 may include amorphous silicon or polycrystalline silicon. The semiconductor pattern 210 may include an oxide semiconductor material. For another example, the semiconductor pattern 210 may include IGZO.

The semiconductor pattern 210 may include a source area, a drain area, and a channel area. The channel area may be disposed between the source area and the drain area. The conductivity of the channel area may be lower than the conductivity of the source area and the conductivity of the drain area. For example, the source area and the drain area may include conductive impurities.

The display device according to the aspect of the present disclosure is described that the lower substrate 100 and the semiconductor pattern 210 of the thin-film transistor 200 are in direct contact with each other. However, a display device according to another aspect of the present disclosure may further include a buffer insulating film, which is interposed between the lower substrate 100 and the thin-film transistor 200. The buffer insulating film may include an insulating material. For example, the buffer insulating film may include silicon oxide.

The gate insulating film 220 may be disposed on the semiconductor pattern 210. The gate insulating film 220 may include an insulating material. For example, the gate insulating film 220 may include silicon oxide and/or silicon nitride. The gate insulating film 220 may include a high-K dielectric material. For another example, the gate insulating film 220 may include a hafnium oxide (HfO) or titanium oxide (TiO). The gate insulating film 220 may have a multi-layer structure.

The gate electrode 230 may be disposed on the gate insulating film 220. The gate electrode 230 may overlap the channel area of the semiconductor pattern 210. The gate electrode 230 may be insulated from the semiconductor pattern 210 by the gate insulating film 220. For example, the gate insulating film 220 may include a side surface being continuous with the side surface of the gate electrode 230. The side surface of the gate electrode 230 may be vertically aligned with the side surface of the gate insulating film 220.

The gate electrode 230 may include an electrically conductive material. For example, the gate electrode 230 may include a metal such as aluminum (Al), chrome (Cr), molybdenum (Mo) and tungsten (W). The gate electrode 230 may have a multi-layer structure.

The interlayer insulating film 240 may be disposed on the semiconductor pattern 210 and the gate electrode 230. The interlayer insulating film 240 may extend to the outside of the semiconductor pattern 210. The gate electrode 230 and the semiconductor pattern 210 may be covered with the interlayer insulating film 240. For example, the interlayer insulating film 240 may extend onto the transmitting area TA of the lower substrate 100.

The interlayer insulating film 240 may include an insulating material. For example, the interlayer insulating film 240 may include silicon oxide.

The source electrode 250 and the drain electrode 260 may be disposed on the interlayer insulating film 240. The source electrode 250 may be electrically connected to the source area of the semiconductor pattern 210. The drain electrode 260 may be electrically connected to the drain area of the semiconductor pattern 210. For example, the interlayer insulating film 240 may include a contact hole for exposing the source area of the semiconductor pattern 210, and a contact hole for exposing the drain area of the semiconductor pattern 210. The drain electrode 260 may be spaced apart from the source electrode 250.

The source electrode 250 and the drain electrode 260 may include an electrically conductive material. For example, the source electrode 250 and the drain electrode 260 may include a metal such as aluminum (Al), chrome (Cr), molybdenum (Mo) and tungsten (W). The drain electrode 260 may include the same material as the source electrode 250. The source electrode 250 may be a multi-layer structure. For example, the source electrode 250 may include a lower source electrode 251 and an upper source electrode 252 disposed on the lower source electrode 251. The structure of the drain electrode 260 may be the same as that of the source electrode 250. For example, the drain electrode 260 may include a lower drain electrode 261 and an upper drain electrode 262 disposed on the lower drain electrode 261.

The display device according to the aspect of the present disclosure is described that the thin-film transistor 200 includes the interlayer insulating film 240 disposed between the gate electrode 230 and the source electrode 250, and between the gate electrode 230 and the drain electrode 260. However, a display device according to another aspect of the present disclosure may include a thin-film transistor 200 in which the semiconductor pattern 210 is disposed between the gate electrode 230 and the source electrode 250, and between the gate electrode 230 and the drain electrode 260.

The organic light-emitting display device according to the aspect of the present disclosure may further include a lower protective film 130 disposed on the thin-film transistor 200. The lower protective film 130 may prevent external moisture or hydrogen from entering the thin-film transistor 200. The thin-film transistor 200 may be covered with the lower protective film 130. The lower protective film 130 may extend onto the transmitting area TA of the lower substrate 100. For example, the lower protective film 130 may be in direct contact with the interlayer insulating film 240 in the region on the transmitting area TA of the lower substrate 100. The lower protective film 130 may include an insulating material. For example, the lower protective film 130 may include silicon oxide and/or silicon nitride.

The display device according to the aspect of the present disclosure may further include an auxiliary electrode 310 in order to prevent brightness non-uniformity due to a voltage drop. The auxiliary electrode 310 may be disposed on the emitting area EA of the lower substrate 100. For example, the auxiliary electrode 310 may be disposed on the thin-film transistor 200. The auxiliary electrode 310 may include an electrically conductive material. For another example, the auxiliary electrode 310 may include a metal such as copper (Cu), molybdenum (Mo), titanium (Ti), aluminum (Al), and tungsten (W). The auxiliary electrode 310 may be a multi-layer structure. For another example, the auxiliary electrode 310 may include a lower auxiliary electrode 311 and an upper auxiliary electrode 312 disposed on the lower auxiliary electrode 311.

The display device according to the aspect of the present disclosure may further include a lower overcoat layer 140 disposed between the lower protective film 130 and the auxiliary electrode 310. The lower overcoat layer 140 may serve to remove a thickness difference by the thin-film transistor 200. For example, the top surface of the lower overcoat layer 140, which is opposite the lower substrate 100, may be a flat surface. The top surface of the lower overcoat layer 140 may be parallel to the surface of the lower substrate 100. The lower overcoat layer 140 may extend onto the transmitting area TA of the lower substrate 100. The lower overcoat layer 140 may include an insulating material. For example, the lower overcoat layer 140 may include an organic insulating material.

The organic light-emitting display device according to the aspect of the present disclosure may further include an auxiliary clad layer 410 disposed on the auxiliary electrode 310. The auxiliary clad layer 410 may serve to prevent damage to the auxiliary electrode 310 attributable to post-processing. For example, the auxiliary electrode 310 may be covered by the auxiliary clad layer 410. The auxiliary clad layer 410 may include an electrically conductive material. The auxiliary clad layer 410 may include a material having low reactivity. For another example, the auxiliary clad layer 410 may include a transparent and electrically conductive material such as ITO.

The light-emitting structure 500 may be disposed on the auxiliary clad layer 410. The light-emitting structure 500 may generate light displaying a unique color. For example, the light-emitting structure 500 may include a lower light-emitting electrode 510, a light-emitting layer 520, and an upper light-emitting electrode 530, which are stacked sequentially.

The display device according to the aspect of the present disclosure may further include an upper overcoat layer 150 disposed between the auxiliary clad layer 410 and a light-emitting structure 500. The upper overcoat layer 150 may serve to remove a thickness difference by the auxiliary electrode 310. For example, the top surface of the upper overcoat layer 150, which is opposite the lower substrate 100, may be a flat surface. The top surface of the upper overcoat layer 150 may be parallel to the top surface of the lower overcoat layer 140. The upper overcoat layer 150 may extend onto the transmitting area TA of the lower substrate 100. The upper overcoat layer 150 may include an insulating material. For example, the upper overcoat layer 150 may include an organic insulating material. The upper overcoat layer 150 may include a material different from that of the lower overcoat layer 140.

The light-emitting structure 500 may be controlled by the thin-film transistor 200. For example, the lower light-emitting electrode 510 of the light-emitting structure 500 may be electrically connected to the drain electrode 260 of the thin-film transistor 200. The upper overcoat layer 150 may include an upper through-hole 151h, through which the lower light-emitting electrode 510 extends. The lower overcoat layer 140 may include a lower contact hole 140h, which overlaps the drain electrode 260 of the thin-film transistor 200. The lower protective film 130 may include a contact hole, which overlaps the lower contact hole 140h.

The display device according to the aspect of the present disclosure may further include a connection electrode 320 disposed between the lower overcoat layer 140 and the upper overcoat layer 150. The connection electrode 320 may connect the lower light-emitting electrode 510 of the light-emitting structure 500 to the drain electrode 260 of the thin-film transistor 200. The lower through-hole 140h and the upper through-hole 151h may overlap the connection electrode 320. The lower light-emitting electrode 510 may be connected to the connection electrode 320 through the upper through-hole 151h. The connection electrode 320 may be connected to the drain electrode 260 through the lower through-hole 140h. The upper through-hole 151h may be spaced apart from the lower through-hole 140h. The connection electrode 320 may include an electrically conductive material. For example, the connection electrode 320 may include a metal such as copper (Cu), molybdenum (Mo), titanium (Ti), aluminum (Al), and tungsten (W). The connection electrode 320 may include the same material as the auxiliary electrode 310. The connection electrode 320 may have a multi-layer structure. For example, the structure of the connection electrode 320 may be the same as that of the auxiliary electrode 310. The connection electrode 320 may include a lower connection electrode 321 and an upper connection electrode 322 disposed on the lower connection electrode 321.

The organic light-emitting display device according to the aspect of the present disclosure may further include a connection clad layer 420 disposed between the connection electrode 320 and the upper overcoat layer 150. The connection clad layer 420 may cover the connection electrode 320. The connection clad layer 420 may include an electrically conductive material. For example, the connection clad layer 420 may include the same material as the auxiliary clad layer 310. The connection clad layer 420 may include a transparent and electrically conductive material such as ITO.

The lower light-emitting electrode 510 may include an electrically conductive material. The lower light-emitting electrode 510 may include a material having high reflectivity. For example, the lower light-emitting electrode 510 may include a metal such as aluminum (Al) and silver (Ag). The lower light-emitting electrode 510 may have a multi-layer structure. For example, the lower light-emitting electrode 510 may be structured such that a reflective electrode including a material having high reflectivity is disposed between transparent electrodes, each including a transparent and electrically conductive material such as ITO.

The light-emitting layer 520 may generate light having a brightness corresponding to the voltage difference between the lower light-emitting electrode 510 and the upper light-emitting electrode 530. For example, the light-emitting layer 520 may include an emitting material layer (EML) including a light-emitting material. The light-emitting material may include an organic light-emitting material, an inorganic light-emitting material or a hybrid light-emitting material. For example, the display device according to the aspect of the present disclosure may be an organic light-emitting display device that includes a light-emitting layer 520 having an organic light-emitting material.

The light-emitting layer 520 may be a multi-layer structure. For example, the light-emitting layer 520 may further include at least one of a hole injection layer (HIL), a hole transport layer (HTL), an electron transport layer (ETL), and an electron injection layer (EIL).

The upper light-emitting electrode 530 may include an electrically conductive material. The upper light-emitting electrode 530 may include a material different from that of the lower light-emitting electrode 510. For example, the upper light-emitting electrode 530 may be a transparent electrode. Accordingly, the organic light-emitting display device according to the aspect of the present disclosure may emit the light generated by the light-emitting layer 520 through the upper light-emitting electrode 530.

The display device according to the aspect of the present disclosure may further include a bank insulating film 160 for insulating between the light-emitting structures 500 disposed on the adjacent pixel areas PA. For example, the bank insulating film 160 may cover an edge of the lower light-emitting electrode 510 of each of the light-emitting structures 500. The bank insulating film 160 may extend onto the transmitting area TA of the lower substrate 100. The light-emitting layer 520 and the upper light-emitting electrode 530 may be stacked on the surface of the lower light-emitting electrode 510 that is exposed through the bank insulating film 160. The bank insulating film 160 may include an insulating material. For example, the bank insulating film 160 may include an organic insulating material such as benzocyclobutene (BCB), poly-imide or photoacryl. The lower overcoat layer 140 and the upper overcoat layer 150 may include a material different from that of the bank insulating film 150.

The light-emitting layer 520 and the upper light-emitting electrode 530 may extend onto the bank insulating film 160. For example, the light-emitting layer 520 and the upper light-emitting electrode 530 may extend onto the transmitting area TA of the lower substrate 100. The upper light-emitting electrode 530 may be electrically connected to the auxiliary electrode 310. Thus, in the display device according to the aspect of the present disclosure, the auxiliary electrode 310 can prevent brightness non-uniformity attributable to a voltage drop of the upper light-emitting electrode 530.

The display device according to the aspect of the present disclosure may further include a partition wall 600 for providing a space in which the upper light-emitting electrode 530 is electrically connected to the auxiliary electrode 310. For example, a portion of the light-emitting layer 520 may be separated from the remaining area by the partition wall 600. The upper light-emitting electrode 530 may be electrically connected to the auxiliary electrode 310 through the space between the areas of the light-emitting layer 520 that are separated from each other by the partition wall 600.

The vertical distance of the partition wall 600 may be greater than the vertical thickness of the bank insulating film 160. For example, the partition wall 600 may include a lower partition wall 610 and an upper partition wall 620 disposed on the lower partition wall 610. The lower partition wall 610 and the upper partition wall 620 may include an insulating material. For another example, the lower partition wall 610 may include the same material as the bank insulating film 160. The upper partition wall 620 may include a material different from that of the lower partition wall 610. For example, the upper partition wall 620 may include silicon oxide and/or silicon nitride.

The display device according to the aspect of the present disclosure may further include an intermediate electrode 550 disposed between the auxiliary electrode 310 and the bank insulating film 160. The intermediate electrode 550 may be electrically connected to the auxiliary electrode 310. For example, the upper overcoat layer 150 may include an upper through-hole 152h exposing a portion of the auxiliary electrode 310. The partition wall 600 may overlap the intermediate electrode 550. For example, the light-emitting layer 520 may expose a portion of the intermediate electrode 550 by the partition wall 600. The bank insulating film 160 may cover an edge of the intermediate electrode 550. The partition wall 600 may be disposed between adjacent bank insulating films 160. The upper light-emitting electrode 530 may be in contact with the portion of the intermediate electrode 550 on which the light-emitting layer 520 is not formed due to the partition wall 600. The upper light-emitting electrode 530 may be electrically connected to the auxiliary electrode 310 through the intermediate electrode 550. The intermediate electrode 550 may include an electrically conductive material. For example, the intermediate electrode 550 may include the same material as the lower light-emitting electrode 510. The intermediate electrode 550 may be a multi-layer structure. For example, the structure of the intermediate electrode 550 may be the same as that of the lower light-emitting electrode 510.

The upper substrate 700 may be opposite the lower substrate 100. For example, the upper substrate 700 may be disposed on the light-emitting structure 500. The upper substrate 700 may extend onto the transmitting area TA of the lower substrate 100. The emitting area EA and the transmitting area TA of the lower substrate 100 may overlap the upper substrate 700.

The upper substrate 700 may include an insulating material. The upper substrate 700 may include a transparent material. For example, the upper substrate 700 may include glass or plastic. The upper substrate 700 may include the same material as the lower substrate 100.

In the display device according to the aspect of the present disclosure, the light-emitting structures 500 of the respective pixel areas may display the same color. For example, the light-emitting structure 500 of each of the pixel areas may include a white light-emitting layer 520. The display device according to the aspect of the present disclosure may further include a black matrix 710 and a color filter 720 disposed on the upper substrate 700. Thus, in the display device according to the aspect of the present disclosure, the pixel areas in which the light-emitting structures 500 displaying the same color are respectively disposed may display different colors from each other. The black matrix 710 may overlap the bank insulating film 160. The color filter 720 may be disposed between the adjacent black matrices 710. For example, the color filter 720 may overlap a portion of the lower light-emitting electrode 510 that is exposed by the bank insulating film 160.

The display device according to the aspect of the present disclosure may further include a filler 800 filling the space between the lower substrate 100 and the upper substrate 700. The filler 800 may prevent damage to the light-emitting structure 500 due to external shocks. For example, the filler 800 may extend between the light-emitting structure 500 and the black matrix 710, and between the light-emitting structure 500 and the color filter 720. The filler 800 may extend onto the transmitting area TA of the lower substrate 100.

The display device according to the aspect of the present disclosure is described that the light-emitting structure 500 is in direct contact with the filler 800. However, a display device according to another aspect of the present disclosure may further include an upper protecting film disposed between the light-emitting structure 500 and the filler 800. The upper protecting film may serve to prevent external moisture from entering the light-emitting structure 500. The upper protecting film may be a multi-layer structure. For example, the upper protecting film may have a structure in which an inorganic film including an inorganic material and an organic film including an organic material are stacked.

The upper AR structure 901 may be disposed on the upper substrate 700. For example, the upper AR structure 901 may be disposed on the outer surface of the upper substrate 700. The upper AR structure 901 may include an upper adhesive layer 911, an upper reflection-preventing structure 921, and an upper color-compensating layer 931.

The upper adhesive layer 911 may be disposed close to the upper substrate 700. The upper adhesive layer 911 may include an adhesive material. For example, the upper adhesive layer 911 may be in direct contact with the upper substrate 700. The upper AR structure 901 may be adhered onto the upper substrate 700 by the upper adhesive layer 911.

The upper reflection-preventing structure 921 may serve to prevent the reflection of external light. For example, the upper reflection-preventing structure 921 may include an upper support layer 921a, an upper reflection-preventing layer 921b, and an upper hard coating layer 921c, which are stacked sequentially. The upper support layer 921a may support the upper reflection-preventing layer 921b. For example, the upper support layer 921a may include polyethylene terephthalate (PET) or triacetate cellulose (TAC). The upper reflection-preventing layer 921b may include a polarizing material. For example, the upper reflection-preventing layer 921b may include a ¼ phase retardation plate. The hard coating layer 921c may prevent damage to the upper reflection-preventing layer 921b.

The upper color-compensating layer 931 may serve to compensate for color variation attributable to the insulating films 240, 130, 140, 150 and 160 stacked on the transmitting area TA. For example, the upper color-compensating layer 931 may be disposed between the upper adhesive layer 911 and the upper reflection-preventing structure 921. The upper color-compensating layer 931 may be in direct contact with the upper adhesive layer 911 and the upper support layer 921a. The upper color-compensating layer 931 may include a dye having a color that complements the color realized by the insulating films 240, 130, 140, 150 and 160 stacked on the transmitting area TA. For example, the upper color-compensating layer 931 may include a blue dye.

Table 1 shows a change ΔT in transmittance and a color of the transmitting area TA in accordance with the content of blue dye in the upper color-compensating layer 931 in the display device according to the aspect of the present disclosure. Here, the value of b* is a numerical value that represents the color of the transmitting area TA. For example, a higher value of b* in the (+) direction represents a deeper yellow. Conversely, a higher value of b* in the (−) direction represents a deeper blue.

TABLE 1

| | % | | | | | | |
|---|---|---|---|---|---|---|---|
| | 1 | 2 | 3 | 7 | 10 | 15 | 20 |
| ΔT(%) | 1.7 | 1.4 | 0.7 | −0.9 | −2.3 | −6.1 | −7.4 |
| b* | 7.1 | 6.4 | 6.2 | 1.1 | 0.9 | −2.7 | −3.1 |

Referring to Table 1, when the content of blue dye in the upper color-compensating layer 931 is 0%, the transmittance of the transmitting area TA may be improved due to the refractive index of the upper reflection-preventing structure 921, but the transmitting area TA may appear yellow. When the content of blue dye in the upper color-compensating layer 931 is increased, the yellow color of the transmitting area TA may become lighter and the transmittance of the transmitting area TA may be deteriorated. When the content of blue dye in the upper color-compensating layer 931 is greater than 0% and is less than or equal to 10%, the transmittance of the transmitting area TA is deteriorated by 0.3% to 0.4% per unit percentage of content. When the content of blue dye in the upper color-compensating layer 931 is in the range from 10% to 15%, the transmittance of the transmitting area TA is deteriorated by 0.7% per unit percentage of content. Further, when the content of blue dye in the upper color-compensating layer 931 is 10% or more, the transmitting area TA may appear blue.

Therefore, the display device according to the aspect of the present disclosure, in which the upper AR structure 901 disposed on the upper substrate 700 includes the upper reflection-preventing layer 921b and the upper color-compensating layer 931, has an effect of improving the transparency of the transmitting area TA without deteriorating the transmittance of the transmitting area TA by adjusting the content of blue dye in the upper color-compensating layer 931 so as to be greater than 0% and to be less than or equal to 10%.

Accordingly, in the display device according to the aspect of the present disclosure, the upper color-compensating layer 931 may have a relatively small thickness in order to achieve high transmittance. For example, the thickness of the upper color-compensating layer 931 may be smaller than the thickness of the upper adhesive layer 911 or the thickness of the upper reflection-preventing structure 921. The upper color-compensating layer 931 may be thinner than the upper reflection-preventing layer 921b. For example, the upper color-compensating layer 931 may have a thickness of approximately 1 μm.

The display device according to the aspect of the present disclosure is described that the upper color-compensating layer 931 includes a blue dye. However, a display device according to another aspect of the present disclosure may be constituted such that the upper color-compensating layer 931 includes a blue pigment. Alternatively, a display device according to another aspect of the present disclosure may be constituted such that the upper color-compensating layer 931 includes both a blue dye and a blue pigment.

Figure 3:
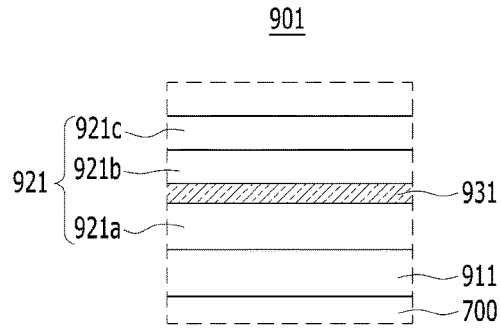
FIGS. 3 to 9 are views respectively illustrating display devices according to other aspects of the present disclosure.
Figure 4:
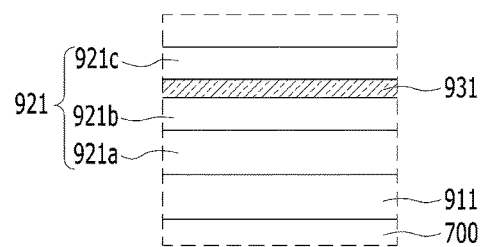

The display device according to the aspect of the present disclosure is described that the upper color-compensating layer 931 is disposed between the upper adhesive layer 911 and the upper reflection-preventing structure 921. However, a display device according to another aspect of the present disclosure may include the upper color-compensating layer 931 disposed inside the upper reflection-preventing structure 921. For example, the display device according to the aspect of the present disclosure, as shown in FIG. 3, may include an upper color-compensating layer 931 disposed between the upper support layer 921a and the upper reflection-preventing layer 921b. Alternatively, the display device according to the aspect of the present disclosure, as shown in FIG. 4, may include the upper color-compensating layer 931 disposed between the upper reflection-preventing layer 921b and the upper hard coating layer 921c. Thus, in the display device according to the aspects of the present disclosure, the position of the upper color-compensating layer 931 may be determined in accordance with convenience in processing. As a result, the display device according to the aspects of the present disclosure has an effect of greatly improving the transparency of the transmitting area TA.

Figure 5:
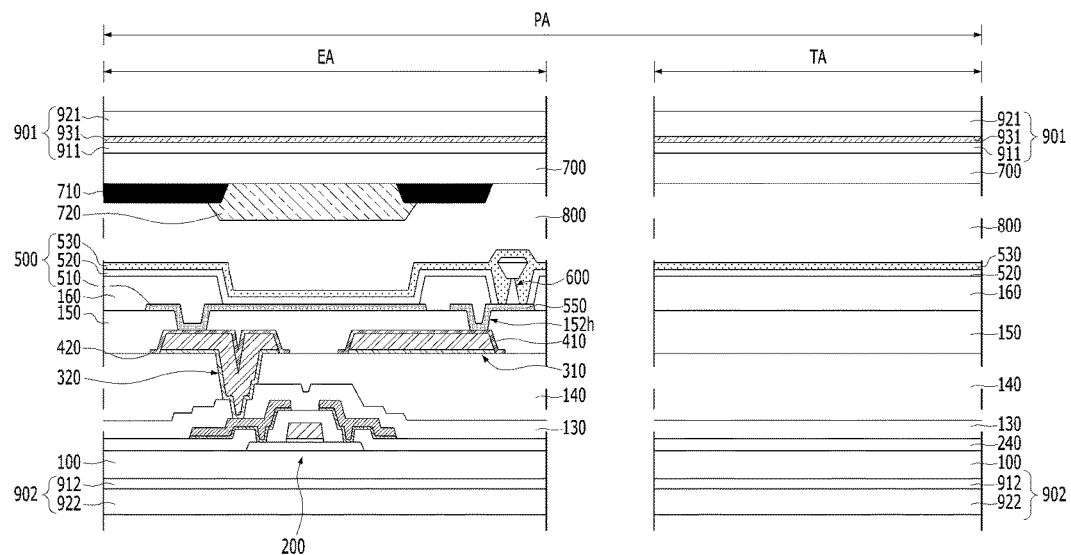

The display device according to the aspect of the present disclosure is described that the upper AR structure 901 is disposed only on the upper substrate 700. However, as shown in FIG. 5, a display device according to another aspect of the present disclosure may include a lower AR structure 902 disposed on the lower substrate 100. The lower AR structure 902 may be disposed on the outer surface of the lower substrate 100. For example, the lower AR structure 902 may include a lower adhesive layer 912 and a lower reflection-preventing structure 922. The structure of the lower reflection-preventing structure 922 may be the same as that of the upper reflection-preventing structure 921. Accordingly, the display device according to the aspect of the present disclosure may have an effect of preventing deterioration of the transmittance of the transmitting area TA and greatly improving the transparency of the transmitting area TA.

Figure 6:
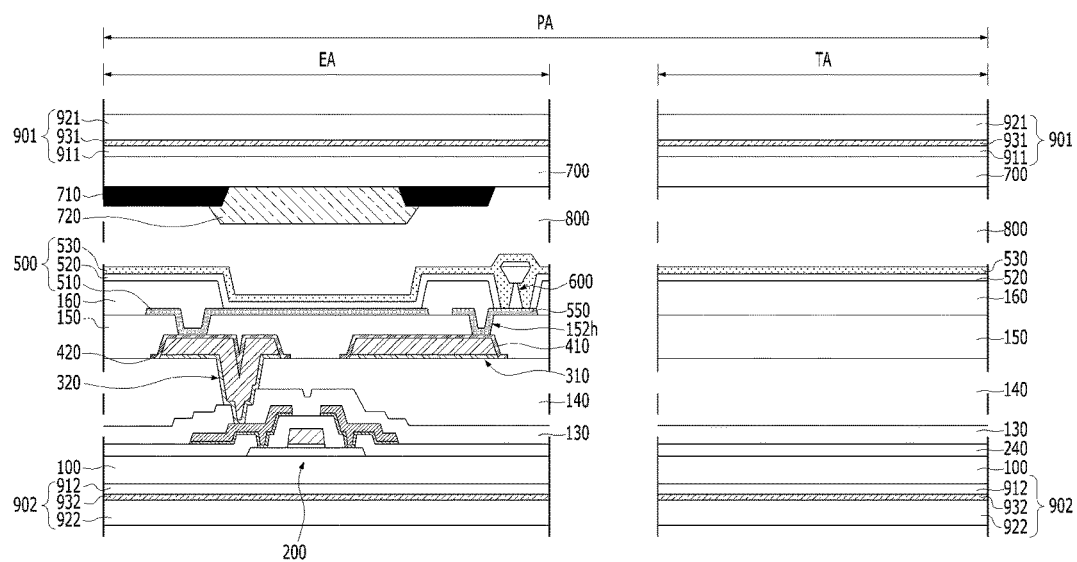

The display device according to the above aspect of the present disclosure is described that the lower AR structure 902 disposed on the lower substrate 100 includes the lower adhesive layer 912 and the lower reflection-preventing structure 922. However, a display device according to a further aspect of the present disclosure, as shown in FIG. 6, may comprises that the lower AR structure 902 further includes a lower color-compensating layer 932 disposed between the lower adhesive layer 912 and the lower reflection-preventing structure 922. The lower color-compensating layer 932 may be equal to the upper color-compensating layer 931 of the upper AR structure 901. For example, the lower color-compensating layer 932 may include a blue dye. The content of blue dye in the lower color-compensating layer 932 may be greater than 0% and may be less than or equal to 10%. For example, the content of blue dye in the lower color-compensating layer 932 may be equal to the content of blue dye in the upper color-compensating layer 931. The thickness of the lower color-compensating layer 932 may be equal to the thickness of the upper color-compensating layer 931. For example, the thickness of the lower color-compensating layer 932 may be approximately 1 μm. Accordingly, the display device of this aspect may have an effect of preventing deterioration of the transmittance of the transmitting area TA and of efficiently adjusting the color of the transmitting area TA.

Figure 7:
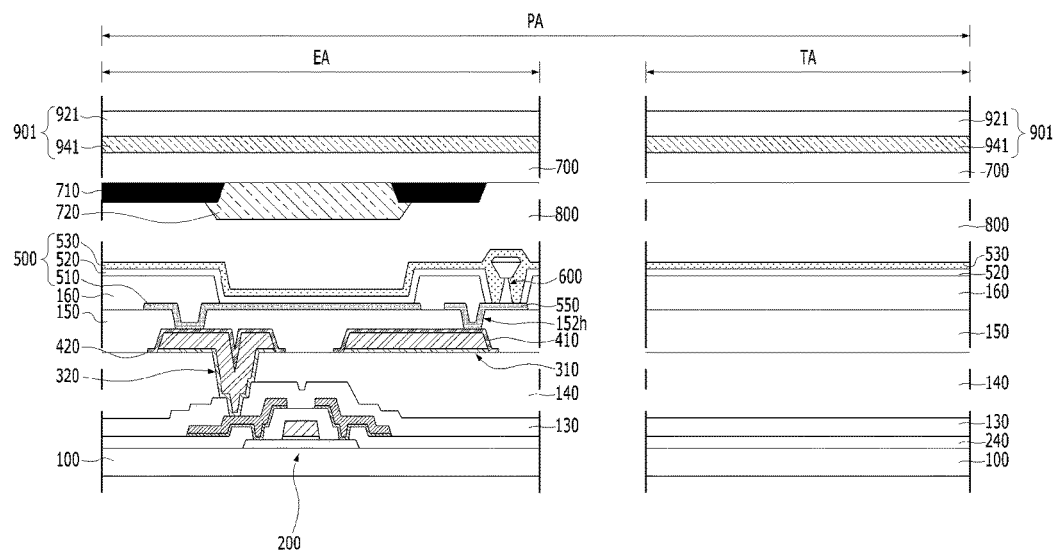

The display device according to the aspect of the present disclosure is described that the upper color-compensating layer 931 containing a blue dye is disposed between the upper adhesive layer 911 and the upper reflection-preventing structure 921. However, a display device according to the aspect of the present disclosure, as shown in FIG. 7, may include an upper color-compensating layer 941, which is in direct contact with the upper substrate 700. The upper color-compensating layer 941 may contain an adhesive material. In the display device of this aspect, the upper reflection-preventing structure 921 may be adhered to the upper substrate 700 by means of the upper color-compensating layer 941. Here, the upper color-compensating layer 941 may be formed to have a relatively large thickness in order to achieve sufficient adhesive force. For example, the upper color-compensating layer 941 may have a thickness of approximately 250 µm. Accordingly, the display device of this aspect may have an effect of efficiently adjusting the color of the transmitting area TA.

Figure 8:
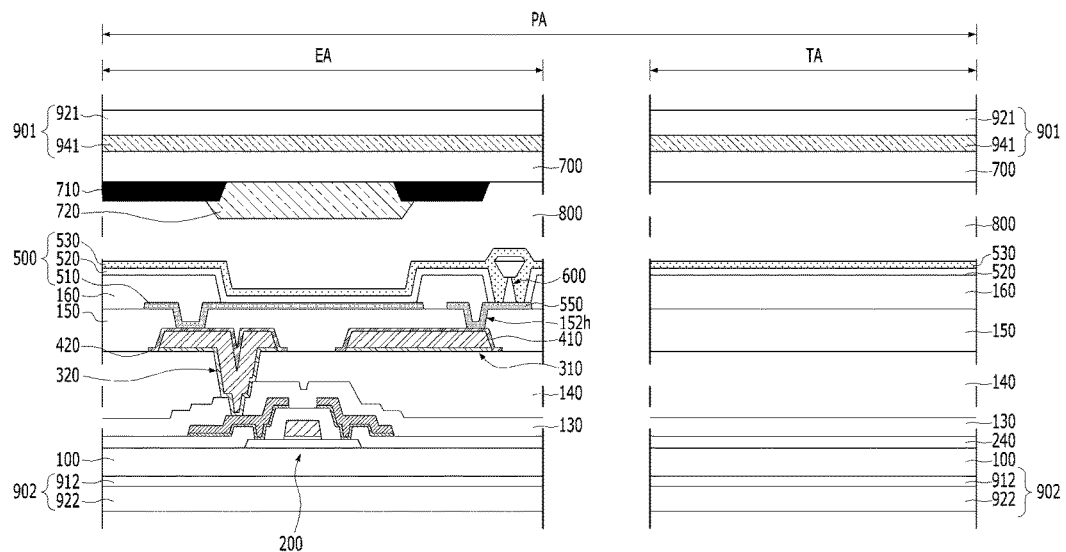

The display device according to the above aspect of the present disclosure is described as including only the upper color-compensating layer 941 that is in direct contact with the upper substrate 700. However, as shown in FIG. 8, the display device according to a further aspect of the present disclosure may further include a lower AR structure 902, which is disposed on the lower substrate 100. The lower AR structure 902 may include a lower adhesive layer 912 and a lower reflection-preventing structure 922. The lower adhesive layer 912 may not contain a dye. For example, the thickness of the lower adhesive layer 912 may be smaller than that of the upper color-compensating layer 941.

Table 2 shows a change ΔT in transmittance and a color of the transmitting area TA in accordance with the content of blue dye in the upper color-compensating layer 941 in the display device according to the aspect of the present disclosure shown in FIG. 8.

TABLE 2

| | % | | | | | | |
|---|---|---|---|---|---|---|---|
| | 0.05 | 0.07 | 0.1 | 0.15 | 0.2 | 0.25 | 0.3 |
| ΔT(%) | 2.9 | 1.8 | 1.4 | 0 | −1 | −1 | −2.2 |
| b* | 7.1 | 6.0 | 4.9 | 4.4 | 3.7 | 3.2 | 2.1 |

Referring to Table 2, when the content of blue dye in the upper color-compensating layer 941 is greater than 0% and is less than or equal to 0.15%, it is possible to prevent deterioration of the transmittance of the transmitting area TA. Accordingly, the display device according to the aspect of the present disclosure shown in FIG. 8, in which the upper AR structure 901 is disposed on the upper substrate 700 and the lower AR structure 902 is disposed on the lower substrate 100, has an effect of improving the transparency of the transmitting area TA without deteriorating the transmittance of the transmitting area TA by adjusting the content of blue dye in the upper color-compensating layer 941 of the upper AR structure 901 so as to be greater than 0% and to be less than or equal to 0.15%.

Figure 9:
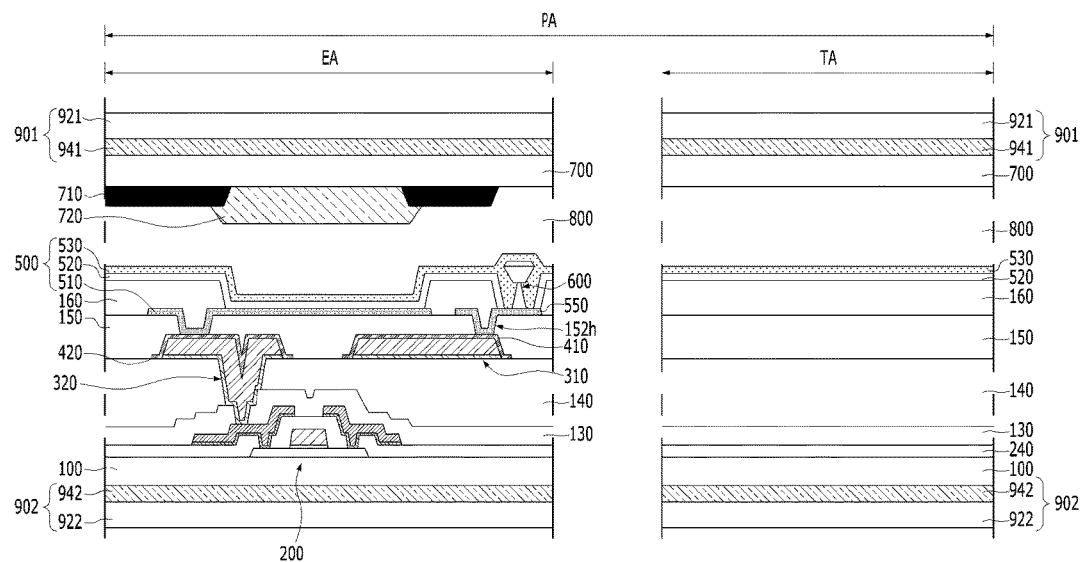

The display device according to the aspect of the present disclosure, as shown in FIG. 8, is described as being constituted such that the lower reflection-preventing structure 922 is adhered to the lower substrate 100 by means of the lower adhesive layer 912. However, as shown in FIG. 9, the display device according to a further aspect of the present disclosure may be constituted such that the lower AR structure 902 includes a lower color-compensating layer 942 containing a blue dye and an adhesive material and a lower reflection-preventing structure 922 disposed on the lower color-compensating layer 942. The thickness of the lower color-compensating layer 942 may be equal to that of the upper color-compensating layer 941. Accordingly, the display device of this aspect may have an effect of improving transparency without deteriorating transmittance.

The display devices according to the above aspects of the present disclosure are described as being constituted such that the lower AR structure 902 disposed on the lower substrate 100 and the upper AR structure 901 disposed on the upper substrate 700 include the color-compensating layers 931, 932, 941 and 942 having the same configuration. However, a display device according to another aspect of the present disclosure may be constituted such that the upper AR structure 901 and the lower AR structure 902 include color-compensating layers 931, 932, 941 and 942 having different configurations. For example, the display device of this aspect may be constituted such that the upper AR structure 901 has a structure in which an upper color-compensating layer 931 is disposed between the upper adhesive layer 911 and the upper reflection-preventing structure 921, and the lower AR structure 902 has a structure in which the lower reflection-preventing structure 922 is adhered to the lower substrate 100 by means of the lower color-compensating layer 942. In the display device of this aspect, the configurations of the upper AR structure 901 and the lower AR structure 902 may be determined in accordance with convenience in processing and efficiency. As a result, the display device of this aspect has an effect of efficiently improving the color that is implemented by the insulating films stacked on the transmitting area.

As is apparent from the above description, a display device according to the present disclosure may be constituted such that an upper AR structure, which includes an upper reflection-preventing layer and an upper color-compensating layer, is disposed on an upper substrate. The upper color-compensating layer may contain a blue dye. Accordingly, the display device according to the present disclosure may have an effect of adjusting a color that is implemented by insulating films stacked on a transmitting area and preventing deterioration of transmittance. In addition, the display device according to the present disclosure may have an effect of improving transparency without deteriorating transmittance.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:
1. A display device comprising:
  a lower substrate including a plurality of pixel areas, each pixel area having an emitting area and a transmitting area;
  a light-emitting structure on the emitting area of each pixel area;
  an upper substrate over the light-emitting structure, the upper substrate having a portion extended to the transmitting area of the lower substrate to form the transmitting area of each pixel with the transmitting area of the lower substrate where light passes through; and
  an upper anti-reflection (AR) structure on the upper substrate, wherein the upper AR structure covering the emitting area and the transmitting area of each pixel area, the upper AR structure an upper reflection-preventing layer and an upper color-compensating layer stacked on each another,
  wherein the upper color-compensating layer has a blue dye.

2. The display device according to claim 1, wherein the upper color-compensating layer has a thickness smaller than that of the upper reflection-preventing layer.

3. The display device according to claim 1, wherein the upper AR structure includes an upper adhesive layer disposed between the upper substrate and the upper color-compensating layer.

4. The display device according to claim 3, wherein the upper color-compensating layer has a thickness smaller than that of the upper adhesive layer.

5. The display device according to claim 3, wherein the upper color-compensating layer has a content of the blue dye being greater than 0% and less than or equal to 10%.

6. The display device according to claim 5, wherein the upper color-compensating layer has a content of the blue dye being greater than 0% and less than or equal to 3%.

7. The display device according to claim 1, further comprising a lower AR structure at the lower substrate, the lower AR structure including a lower reflection-preventing layer and a lower adhesive layer.

8. The display device according to claim 7, wherein the lower AR structure includes a lower color-compensating layer between the lower reflection-preventing layer and the lower adhesive layer, and
wherein the lower color-compensating layer includes a blue dye.

9. A display device comprising:
a lower substrate including a plurality of pixel areas, each pixel area having emitting areas and transmitting areas;
an upper substrate over the lower substrate and having a portion extended to the transmitting area of the lower substrate to form the transmitting area of each pixel with the transmitting area of the lower substrate where light passes through;
an upper reflection-preventing layer on the upper substrate; and
an upper color-compensating layer between the upper substrate and the upper reflection-preventing layer, the upper color-compensating layer covering the transmitting areas and the emitting areas of the lower substrate,
wherein the upper color-compensating layer includes a blue dye.

10. The display device according to claim 9, further comprising an upper support layer between the upper color-compensating layer and the upper reflection-preventing layer.

11. The display device according to claim 9, wherein the upper color-compensating layer is in direct contact with the upper substrate, and
wherein the upper color-compensating layer includes an adhesive material.

12. The display device according to claim 11, further comprising:
a lower reflection-preventing layer on the lower substrate; and
a lower adhesive layer between the lower substrate and the lower reflection-preventing layer,
wherein the upper color-compensating layer has a thickness greater than that of the lower adhesive layer.

13. The display device according to claim 11, wherein the upper color-compensating layer has a content of the blue dye 0% and is less than or equal to 0.15%.

14. The display device according to claim 9, wherein the upper color-compensating layer includes the blue dye.

15. A display device having a plurality of pixel areas, each pixel area including an emitting area and a transmitting area, comprising:
first and second substrates facing each other, the first substrate having a portion extended to a transmitting area of the second substrate to form the transmitting area of each pixel with the transmitting area of the second substrate where light passes through;
a light-emitting structure at the emitting area of the first substrate; and
an anti-reflection (AR) structure disposed on at least one of the first and second substrates, the AR structure including a reflection-preventing layer and a color-compensating layer having a blue dye,
wherein the AR structure covers the emitting area and the transmitting area.

16. The display device according to claim 15, wherein the color-compensating layer has a thickness smaller than that of the reflection-preventing layer.

17. The display device according to claim 15, wherein the AR structure includes an adhesive layer attaching the AR structure to at least one of the first and second substrates.

18. The display device according to claim 17, wherein the color-compensating layer has a thickness smaller than that of the adhesive layer.

19. The display device according to claim 17, wherein the color-compensating layer has a content of the blue dye being greater than 0% and less than or equal to 10%.

20. The display device according to claim 19, wherein the upper color-compensating layer has a content of the blue dye being greater than 0% and less than or equal to 3%.

* * * * *

UNITED STATES PATENT AND TRADEMARK OFFICE
CERTIFICATE OF CORRECTION

PATENT NO. : 10,209,406 B2
APPLICATION NO. : 15/668865
DATED : February 19, 2019
INVENTOR(S) : Seok-Won Ji et al.

Page 1 of 1

It is certified that error appears in the above-identified patent and that said Letters Patent is hereby corrected as shown below:

In the Claims

Column 14 Claim 1:
Line 61, delete "wherein".
Line 63, after the word "structure" insert the word --including--.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*